United States Patent [19]
Vidwans et al.

[11] Patent Number: 5,777,928
[45] Date of Patent: Jul. 7, 1998

[54] MULTI-PORT REGISTER

[75] Inventors: Rohit A. Vidwans, Beaverton; Wesley D. McCullough, Aloha; Joel Huang; Joseph F. Rohlman, both of Portland, all of Oreg.

[73] Assignee: Intel Corporation, Santa Clara, Calif.

[21] Appl. No.: 785,575

[22] Filed: Jan. 21, 1997

Related U.S. Application Data

[63] Continuation of Ser. No. 174,715, Dec. 29, 1993, abandoned.
[51] Int. Cl.$^6$ ............................................. G11C 7/00
[52] U.S. Cl. ............................. 365/189.05; 365/230.06; 365/203
[58] Field of Search .................. 365/189.05, 230.06, 365/203

[56] References Cited

U.S. PATENT DOCUMENTS

| | | | |
|---|---|---|---|
| 5,260,908 | 11/1993 | Ueno | 365/185.05 |
| 5,309,395 | 5/1994 | Dickinson et al. | 365/203 |

OTHER PUBLICATIONS

IEEE Micro, Published Jun., 1991, pp. 10–13, and 63–73, Authors: Val Popescu, et al., Entitled: The Metaflow Architecture.

Superscalar Microprocessor Design; author: Mike Johnson; a publication of Prentice–Hall Series in Innovative Technology; Prentice–Hall, 1991.

*Primary Examiner*—A. Zarabian
*Attorney, Agent, or Firm*—Blakely, Sokoloff, Taylor & Zafman

[57] ABSTRACT

A multi-port register contains a plurality of cells each capable of storing at least two states. The cells contain at least one read and one write port. Each read port contains a corresponding read enable line, a read data line, and a read transistor stack. Each write port contains a corresponding write enable line, write data line, and a write transistor stack. The read data line is coupled to a pre-charge circuit that charges the read data line to a pre-determined threshold level prior to reading the contents of the cell. The read transistor stack couples the output of the cell to the corresponding read data line such that the read data line is pulled to ground when the cell stores a first logic state, and the read data line retains the pre-determined voltage state when the cell stores the second logic state. The write transistor stack couples the write data line to the cell such that writing a first logic state on the write data line pulls the input to the cell to a low logic state, and writing a second logic state on the write data line drives the input to the cell to a high logic state. The multi-port register has application for use in a superscalar microprocessor performing out-of-order dispatch and execution and speculative execution.

8 Claims, 5 Drawing Sheets

MULTI-PORT REGISTER

This is a continuation of application No. 08/174,715, filed Dec. 29, 1993, abandoned.

FIELD OF THE INVENTION

The present invention relates to data storage in data processing systems, and more specifically to storing data in a multi-port register.

ART BACKGROUND

In general, data processing systems employ registers to store data. The registers are constructed in a variety of ways depending upon the application for the data processing system. For example, a data processing system utilizing a register for latching data on a bus may only require one read and one write port. In more complex data processing systems, applications may require more complex registers having multiple read and write ports.

Microprocessors utilize registers to implement file registers for use in conjunction with executing instructions. The file registers store data subsequent to execution by an execution unit in the microprocessor. The complexity of the register file required for operation of the microprocessor is dependent upon the architecture of the microprocessor. For example, in a superscaler microprocessor, some instructions are executed in parallel which increases the need for access to the register file. Consequently, a register file for use in operation of a complex superscaler microprocessor may require multi-ports.

Typically, storage arrays employ data lines to transmit data from a selected data cell to a comparator system to determine the state stored in the selected cell. In all types of storage arrays employing electrical conductors, parasitic capacitance is introduced on the electrical conductors. The capacitance introduced on the electrical conductors during a read operation causes slow rise times. The slow rise times result in slow access time specifications for the storage array. Therefore, in order to maximize access times to a storage array, such as a register file, it is desirable to reduce or eliminate slow rise times. By increasing the access times to the register file, fast read and write operations are attainable. Therefore, in addition to providing multi-ports for the register file in a superscalar microprocessor, it is also desirable to provide quick access to the register file.

When reading data from storage arrays, sense amplifiers are often utilized to compare the state of a selected cell to a common reference. However, in microprocessors requiring multi-port register files, the multi-port register file requires multiple sense amplifiers. Because die size is typically a concern in integrated circuit design, it is desirable to design a multi-port register file that does not require the use of sense amplifiers while maintaining high integrity in a read operation.

SUMMARY AND OBJECTS OF THE INVENTION

Therefore, it is an object of the present invention to provide a multi-port register.

It is a further object of the present invention to access a multi-port read and write register with successive read and write operations.

It is a further object of the present invention to minimize access times associated with reading and writing to a multi-port register.

It is a further object of the present invention to eliminate the use of sense amplifiers for the read operation in a multi-port register.

These and other objects of the present invention are realized in an arrangement including a memory cell capable of storing at least two states and having at least one read and one write port. Each read port contains a read enable line and a read data line. The read data line is coupled to a pre-charge circuit that charges the read data line to a pre-determined threshold level prior to reading the contents of the cell. Each read port also contains a read transistor stack comprising first and second read transistors. The first read transistor is coupled to ground and is controlled by the state of the cell such that a first logic state stored in the cell results in conduction of current in the first read transistor. The second read transistor couples the first read transistor to the read data line. The second read transistor is controlled by the read enable line such that enabling the second read transistor provides a conductive path from the read data line to the first read transistor. Consequently, when the read enable line is activated, the read data line is pulled to ground when the cell stores a first logic state, and the read enable line retains the pre-determined voltage level when the cell stores a second state.

Each write port on the multi-port register contains a corresponding write enable line, write data line, and a write transistor stack. The write transistor stack includes a first, second and third write transistors. The first write transistor is coupled to ground and is controlled by the write data line such that placing a first logic level on the write data line results in conduction of current in the first write transistor. The second write transistor couples the first write transistor to a first side of the memory cell, and is controlled by the write enable line. The third write transistor couples a second side of the memory cell to the corresponding write data line and is controlled by the corresponding write enable line. In order to write to the cell on a particular write port, the corresponding write enable line is activated and data is placed on the write data line. If the data is a first logic state, the first write transistor conducts current to pull the first side of the cell to ground. Alternatively, if the data is a second logic state, then the third write transistor drives the second side of the cell to the second logic state.

The multi-port register cell of the present invention has application for use in a superscalar microprocessor performing out-of-order execution and speculative execution. The microprocessor contains an instruction fetch and decoder circuits for issuing and decoding instructions, respectively, in the program order. The microprocessor also includes a superscalar execution cluster, containing a plurality of execution units, and an out-of-order cluster for performing out-of-order dispatch. The out-of-order cluster contains a reorder buffer configured in accordance with the multi-port register of the present invention. The reorder buffer stores source data for use in execution in the superscalar execution unit. The reorder buffer contains a plurality of read ports, so as to allow simultaneous reading of two source entries for each execution unit, and a plurality of write ports coupled to each execution unit. To perform out-of-order execution, instructions, including source data, are transferred to the superscalar execution unit from the plurality of read ports. Upon completion of execution, the results are written back to the reorder buffer via the write ports. An additional read port is provided to the reorder buffer to allow reading data for transfer of data to commit to the architectural state of the microprocessor.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

Methods and apparatus for a multi-port register are disclosed. In the following description, for purposes of explanation, specific nomenclature is set forth to provide a thorough understanding of the present invention. However, it will be apparent to one skilled in the art that these specific details are not required to practice the present invention. In other instances, well known circuits and devices are shown in block diagram form to avoid obscuring the present invention unnecessarily.

Figure 1:
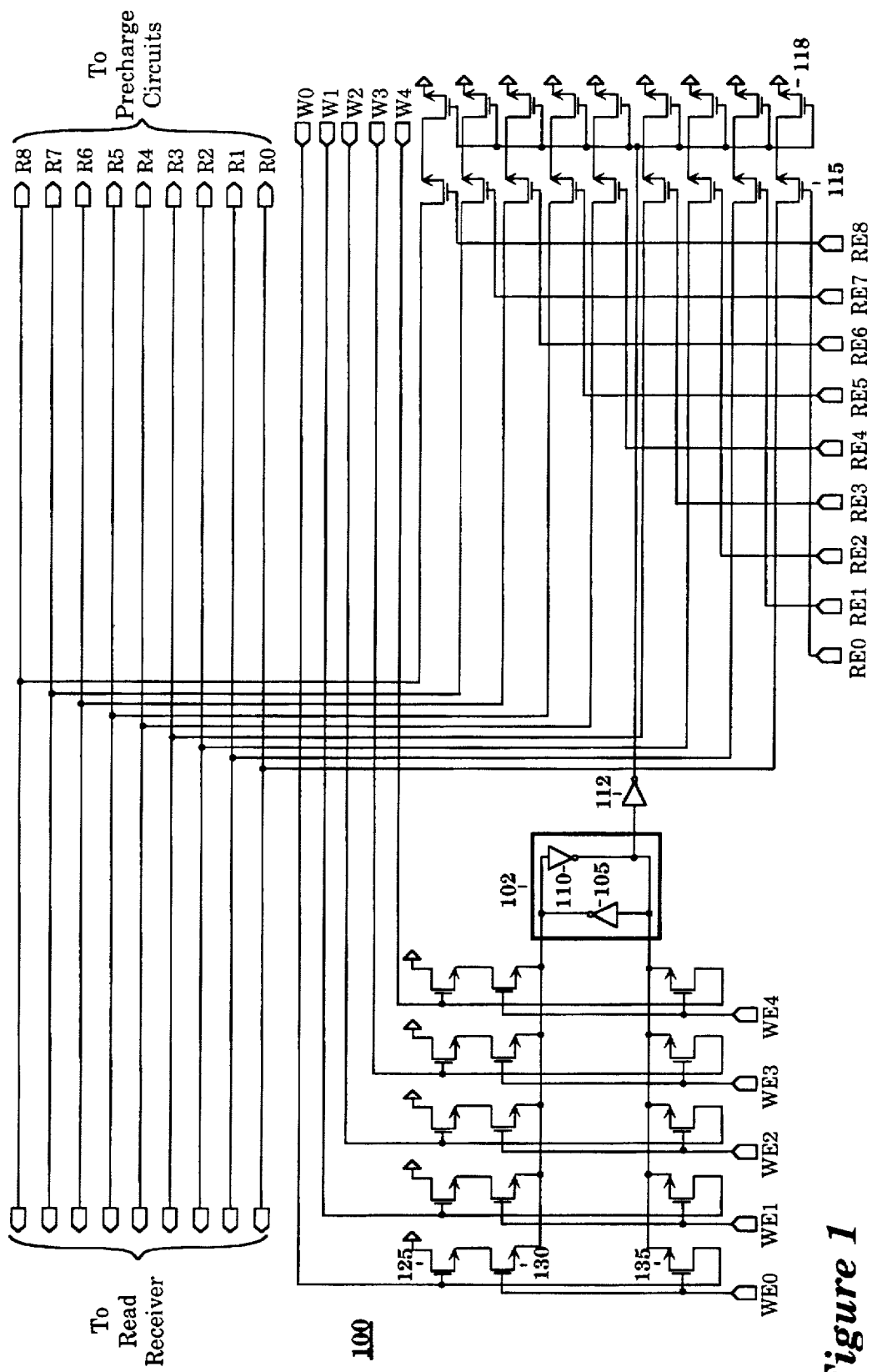
FIG. 1 illustrates a first embodiment of a multi-port cell configured in accordance with the present invention.

FIG. 1 illustrates a first embodiment of a multi-port cell configured in accordance with the present invention. A storage cell 102 stores two states to represent a single bit of data. In a preferred embodiment, the storage cell 102 comprises dual cross coupled complementary metal oxide semiconductor (CMOS) inverters 105 and 110. The output of CMOS inverter 105 retains the "true" state of the cell, and the output of CMOS inverter 110 retains the inverted or "bar" state of the cell. In a preferred embodiment, the CMOS inverter 105 contains a p-channel metal oxide semiconductor field effect transistor (MOSFET) having a channel aspect ratio of 2.0 microns, and a N-channel MOSFET having a channel aspect ratio of 1.3 microns. The CMOS inverter 110 contains a P-channel MOSFET having a channel aspect ratio of 1.6, and a N-channel MOSFET having a channel aspect ratio of 1.3 microns.

For use as a register, the multi-port cell 100 of the present invention contains at least one read port and one write port. However, as explained more fully below, the multi-port cell may comprise multiple read and write ports. For each read port, the multi-port cell 100 contains a read enable line, a read data line, and a read transistor stack. For each write port, the multi-port cell 100 contains a write enable line, a write data line, and a write transistor stack. For the embodiment illustrated in FIG. 1, the multi-port cell 100 comprises nine read ports and five write ports. For the nine read ports illustrated in FIG. 1, the read data lines are labeled R0-R8, and the read enable lines are labeled RE0-RE8. Although the multi-port cell of the present invention is described in connection with nine read ports and five write ports, any number of read and write ports on the multi-port cell of the present invention may be implemented without deviating from the spirit and scope of the invention.

The read transistor stack contains a first read transistor and a second read transistor. The multi-port cell embodiment illustrated in FIG. 1 contains 9 read ports, and therefore the embodiment contains nine read transistor stacks. For the embodiment illustrated in FIG. 1, the first and second transistors in the read transistor stack are implemented with n-channel metal oxide semiconductor field effect transistors (N-MOS transistors). The read stack transistors are coupled such that the drain of the first read transistor is coupled to the source of the second read transistor. In addition, the source of the first read transistor is coupled to ground, and the drain of the second read transistor is coupled to the corresponding read data line. The gate of the first read transistor is coupled to the corresponding read enable control line. The "bar" output of the storage cell 102 is coupled to an inverter 112. The output of inverter 112 is coupled to the gate of each first read transistor. For each read port on the multi-port cell 100, an inverter is coupled to the corresponding read data line. In addition, each read data line is coupled to a precharge circuit. Prior to a read operation of the multi-port cell 100, the read data lines, R0-R8, are pre-charged to a pre-determined voltage level.

In order to read the state stored in the storage cell 102, the read enable lines (RE0-RE8) are activated to select the desired read port. The following example illustrates a read operation to read the state stored in the storage cell 102 on read port 0. For the embodiment illustrated in FIG. 1, the read transistor stack for port 0 contains the first read transistor, N-MOS transistor 118, and the second read transistor N-MOS transistor 115. For read transistor stacks implemented with N-MOS transistors, a high logic level signal on a read enable line indicates selection of the corresponding read port. Therefore, in order to select read port 0 for the current example, the read enable line "RE0" is driven to a high logic level.

When the "RE0" line is activated to a high logic level, the gate of N-MOS transistor 115 receives a high logic level. If the storage cell 102 stores a high logic level, then the output of inverter 110 is a low logical level. Consequently, the output of inverter 112 is a high logic level. The output of inverter 112, being coupled to the gate of all first read transistors, drives the gate of N-MOS transistor 118 to a high logic level. A high logic level applied to the gates of N-MOS transistors 115 and 118 biases N-MOS transistors 115 and 118 in an active region permitting conduction of current from the drain of N-MOS transistor 115 to the source of N-MOS transistor 118. The biasing of N-MOS transistors 118 and 115 in an active region results in pulling the source of N-MOS transistor 118 to ground. Consequently, the read data line "R0" is pulled toward ground via the conduction path from N-MOS transistor 115 to N-MOS transistor 118. The "R0" data line is inverted by a corresponding read receiver (FIG. 2) to provide a high logic level indicating the high logic state stored in the storage cell 102.

Alternatively, if the storage cell 102 stores a low logic level on the "true" side of the cell, the output of inverter 112 is also a low logic level. The low logic level output of inverter 112 turns off the N-MOS transistor 118 such that the first read transistor does not conduct current. Consequently, the source of N-MOS transistor 115 is not pulled toward ground. During the read operation to port 0, a high logic level is applied to the gate of N-MOS transistor 115 to enable read port 0, but the off state of N-MOS transistor 118 results in no conduction of current through N-MOS transistor 115. Consequently, the pre-charged high level state on read data line "R0" is maintained. The read data line "R0" line is inverted by the corresponding read receiver resulting in a low logic level output to indicate the state of the storage cell 102.

For each write port, the multi-port cell of the present invention contains a corresponding write transistor stack. The multi-port cell embodiment illustrated in FIG. 1 contains five write ports, and therefore the embodiment contains five write transistor stacks. The write transistor stack contains a first, second and third write transistors. For the embodiment illustrated in FIG. 1, the first, second and third write transistors in the write transistor stack are implemented with n-channel metal oxide semiconductor field effect transistors (N-MOS transistors). The first and second write transistors have a channel aspect ratio of 2.0, and the third write transistor has a channel aspect ratio of 2.5. The source of the first write transistor is coupled to ground, and the drain is coupled to the source of the second write transistor. The drain of the second write transistor is coupled to the "true" side of the storage cell 102. The source of the third write transistor is coupled to the "bar" side of the storage cell 102, and the drain is coupled to the corresponding write data line. The gate of each first write transistor is coupled to the corresponding write data line, and the gate of each second and third write transistors are coupled to the corresponding write enable line. For write port 0 on the storage cell 102 in FIG. 1, the first write transistor is labeled "125", the second write transistor is labeled "130", and the third write transistor is labeled "135".

For the embodiment employing N-MOS transistors for the write transistor stack, a high logic level signal on a write enable line indicates selection of the corresponding write port. The logic for the write circuit is inverted such that driving a high logic level signal on a data write line results in a low logic level stored in storage cell 102, and driving a low logic level signal on a data write line results in a high logic level stored in storage cell 102. The following example illustrates a write operation to store a low logic state on the "true" side of the storage cell 102 via write port 0. In operation, to write a low logic state to the storage cell 102 on write port 0, the write enable line "WE0" is set to a high logic level, and the write data line "W0" is driven to a high logic state. The high logic state from the "W0" line applied to the gate of the first write transistor 125, and the high logic state from the "WE0" line applied to the gate of the second write transistor 130 biases the first and the second write transistors (125 and 130) in an active region, thereby pulling the "true" side of the storage cell 102 to a low logic level. The high logic state from the "WE0" line applied to the gate of the third write transistor 135, and the high logic state from the "W0" applied to the drain of the third write transistor 135 bias the third write transistor 135 in an active region, thereby pulling the "bar" side of the storage cell 102 to a high logic level.

The following example illustrates a write operation to store a high logic state on the "true" side of the storage cell 102 via write port 0. In order to write a high logic state to the storage cell 102 on write port 0, the write enable line "WE0" is set to a high logic state, and the write data line "W0" is driven to a low logic state. The low logic level from the "W0" line applied to the gate of the first write transistor 125 turns off the first write transistor 125. Consequently, a conductive path from the "true" side of storage cell 102 to ground in not formed, and the "true" side of storage cell 102 is not pulled to ground. The high logic level from the "WE0" line applied to the gate of the third write transistor 135, and the low logic level from the "W0" line applied to the drain of the third write transistor 135 results in pulling the "bar" side of the storage cell 102 to ground. Consequently, writing a low logic level to the "bar" side of the storage cell 102 results in storage of a high logic level in the "true" side of the storage cell 102.

Figure 2:
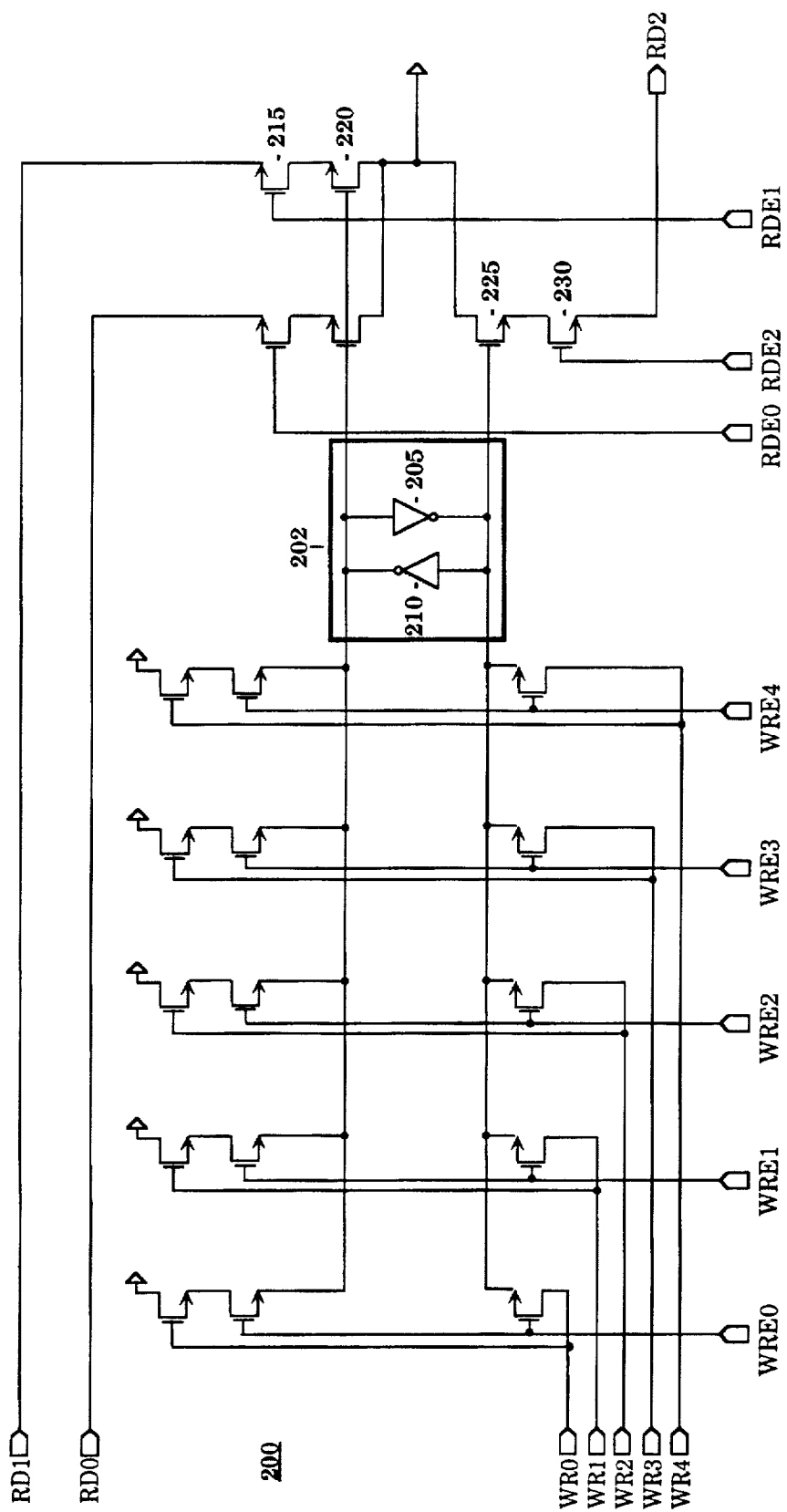
FIG. 2 illustrates a second embodiment of a multi-port cell configured in accordance with the present invention.

FIG. 2 illustrates a second embodiment of a multi-port cell configured in accordance with the present invention. A storage cell 202 contains dual cross coupled complementary metal oxide semiconductor (CMOS) inverters 205 and 210. The output of CMOS inverter 205 retains the "true" state of the cell, and the output of CMOS inverter 210 retains the inverted or "bar" state of the cell. For the second embodiment illustrated in FIG. 2, the storage cell 202 contains "5" write ports and "3" read ports; however, the storage cell 202 may comprise any number of read and write ports without deviating from the spirit and scope of the invention. Each write port contains a write enable line "WRE", and a write data line "WR". The write ports coupled to the storage cell 202 are configured in accordance with the write transistor stack of the first embodiment shown in FIG. 1. Each read port comprises a read transistor stack having a first read transistor and a second read transistor. For the second embodiment, the first and second read transistors are implemented with N-channel MOS transistors. The first and second read transistors have a channel aspect ratio of 2.7 when coupled to the true side of the storage cell 202, and a channel aspect ratio of 2.4 when coupled to the bar side of the storage cell 202. Each read port contains a read enable line "RDE", and a read data line "RD".

For the read stack of the second embodiment, the source of the first read transistor is coupled to corresponding read data line, and the drain of the first transistor is coupled to source of the second read transistor. The drain of the second read transistor is coupled to ground. The gate of the second read transistor is coupled to the storage cell 202, and the gate of the first read transistor is coupled to the read enable line. The read transistor stack of the second embodiment is coupled to either the "true" side (output of CMOS inverter 210) or the "bar" side (output of CMOS inverter 205) of the storage cell 202. For the second embodiment illustrated in FIG. 2, read ports "0" and "1" are coupled to the true side of the storage cell 202, and read port "2" is coupled to the bar side of the storage cell 202. However, the read ports may be coupled to either the true side or the bar side of the storage cell 202.

For the read port "1" illustrated in FIG. 2, the first read transistor is labeled "215", and the second read transistor is labeled "220". For the read port "2" illustrated in FIG. 2, the first read transistor is labeled "230", and the second read transistor is labeled "225". Prior to a read on the storage cell 202, the read data lines are pre-charged to a voltage level representing a high logic level. In order to read the storage cell 202 from read port "1", the read enable line "RDE1" is set to a high logic level. If the true side of the storage cell 202 is a high logic level, then the gate of the second read transistor 220 is biased to conduct current. Consequently, a conductive path is formed from the read data line "RD1" to ground, thereby driving the "RD1" line to a low logic level. In a read receiver (not shown), the read data line "RD1" is inverted to represent the high logic level stored on the true side of the storage cell 202. Alternatively, if the true side of the storage cell 202 is a low logic level, then the gate of the second read transistor 220 is biased to conduct no current, and the high logic level on the "RD1" line is retained. In the read receiver (not shown), the read data line "RD1" is inverted to represent the low logic level. When reading the storage cell 202 from the bar side, an inverter at the read receiver is not required.

Figure 3:
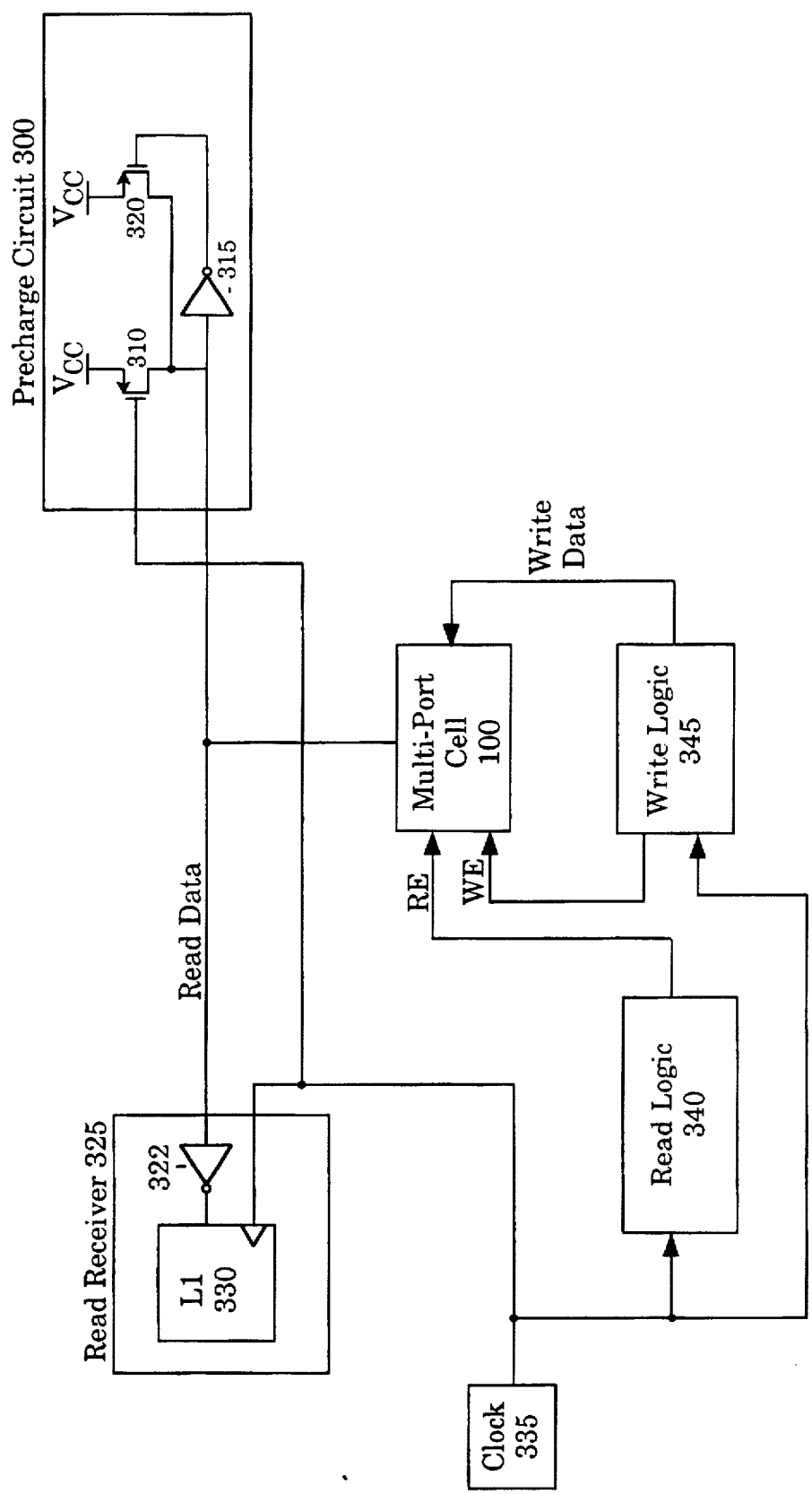
FIG. 3 illustrates an interface circuit for the multi-port cell configured in accordance with the present invention.

FIG. 3 illustrates an interface circuit for the multi-port cell configured in accordance with the present invention. In general, the interface circuit contains a pre-charge circuit 300, read receiver 325, read logic 340, and write logic 345. In addition, the timing for the read and write operations on the multi-port cell 350 is provided by a clock 335. The multi-port cell 100 incorporates the circuit shown in FIG. 1. For purposes of explanation, the interface circuit illustrated in FIG. 3 is simplified to support one read port and one write port. In order to interface to a multi-port read and write cell, a pre-charge circuit and read receiver is provided for each read port.

As described above, the precharged circuit generates a pre-determined voltage level on each read data line prior to each read operation. For the embodiment illustrated in FIG. 1, the pre-determined voltage level indicates a high logic state. The pre-charge circuit 300 contains two P-channel MOS transistors 310 and 320, and an inverter 315. The source of P-MOS transistors 310 and 320 are coupled to a power supply, such as $V_{cc}$. The drains of P-MOS transistors 310 and 320 are coupled together and to the input of the inverter 315. The output of the inverter 315 is coupled to the gate of P-MOS transistor 320, and the gate of P-MOS transistor 310 is coupled to a clock signal from the clock 335. In operation, each read data line is precharged during a first phase of the clock cycle. In one embodiment of the present invention, the first phase is defined as the low phase of the clock signal.

During the low phase of the clock cycle, P-MOS transistor 310 is biased in an active region to conduct current. Consequently, the drain of P-MOS transistor 310 is pulled toward the power supply voltage, $V_{cc}$, and the corresponding read data line is charged to the voltage level at the drain of P-MOS transistor 310. The P-MOS transistor 320 provides additional charging such that when the read data line retains a high logic level, the output of inverter 315 is a low logic level. Consequently, the low logic level output from the inverter 315 is applied to the gate of P-MOS transistor 320 resulting in conduction of current from the drain to the source.

For each read operation executed in the high phase of the clock cycle, the read logic 340 receives a clock signal from the clock 335, and activates the read enable lines to select the desired read ports. The read logic 340 is intended to represent a large category of interface and control circuits, such as a bus, which are well known in the art and will not be described further. During the second phase of the clock signal, the read logic 340 activates the read enable lines. In one embodiment of the present invention, the second phase of the clock signal is defined as the high phase of the clock signal. Each read data line is coupled to a read receiver such as read receiver 325. The read receiver 325 comprises a data latch 330 and an inverter 322. For use in conjunction with the multi-port cell 200 illustrated in FIG. 2, the read receiver 325 does not contain an inverter when the read transistor stack is coupled to the bar side of the storage cell 202. The read receiver contains the inverter 322 for operation in conjunction with the read transistor stack embodiment illustrated in FIG. 1, and for operation in conjunction with the read transistor stack embodiment illustrated in FIG. 2 when the read transistor stack is coupled to the true side of the storage cell 202.

The output of the inverter 322 is coupled to the input of the data latch 330. The data latch 330 is coupled to the clock 335 to provide timing for operation of the data latch. In a preferred embodiment, the data latch 330 is edge triggered such that a transition from a high logic level to a low logic level latches the data in the data latch 330. In order to generate a read operation for the multi-port cells 100 and 200, the read data lines are charged on the low phase of the clock. During the subsequent high phase of the clock, the read logic 340 enables the desired read ports by activating the corresponding read enable lines. Also, during the high phase of the clock signal, the data on the read data lines becomes valid, and the data is latched in the read receiver on the falling edge of the clock signal.

For each write operation, executed on the low phase of the clock cycle, the write logic 345 receives a clock signal from the clock 335, and activates the write enable lines to select the desired write ports. In addition, the write logic 345 contains an inverter (not shown) that inverts data for operation in conjunction with the write circuit illustrated in FIG. 1 and FIG. 2. The write logic 345 is intended to represent a large category of interface and control circuits, such as a bus, which are well known in the art and will not be described further. During the first phase of the clock signal, the write enable lines are activated. In one embodiment of the present invention, the first phase of the clock signal is defined as the low phase. In order to generate a write operation for the multi-port cell of the present invention, the write enable lines are activated, and the data are placed on the write data lines during the low phase of the clock. The write operation is completed during the low phase of the clock such that the storage cell is driven to a stable state within the low phase.

The multi-port cell of the present invention permits back to back write and read operations. As discussed above, during the low phase of the clock, the read data lines are charged, and a write operation is permissible. During the high phase of the clock, data are read from the read data lines and subsequently latched in the read receiver. Consequently, back to back write and read operations for the multi-port cell of the present invention may be executed in the same clock cycle. In order to stabilize the state of the cell from a write operation for a subsequent read operation, the sizing of the write transistor stack is large enough to drive the state of the storage cell during the low phase of the clock. In one embodiment of the present invention, the write stack transistors are implemented as N-MOS transistors comprising a channel aspect ratio of 2.8 microns. The size of the transistors in the write transistor stack permits writing data to a single side of the storage cell 102. If an indeterminate state resides in the cell during the high phase of the clock, a depletion of charge on the pre-charged read data lines may result. Such a depletion of charge may corrupt the data for a subsequent read operation. Based on the drive capability of the write transistor stack, a cell receiving data in a write operation during the low phase of a clock may be read on the high phase of the same clock cycle.

Figure 4:
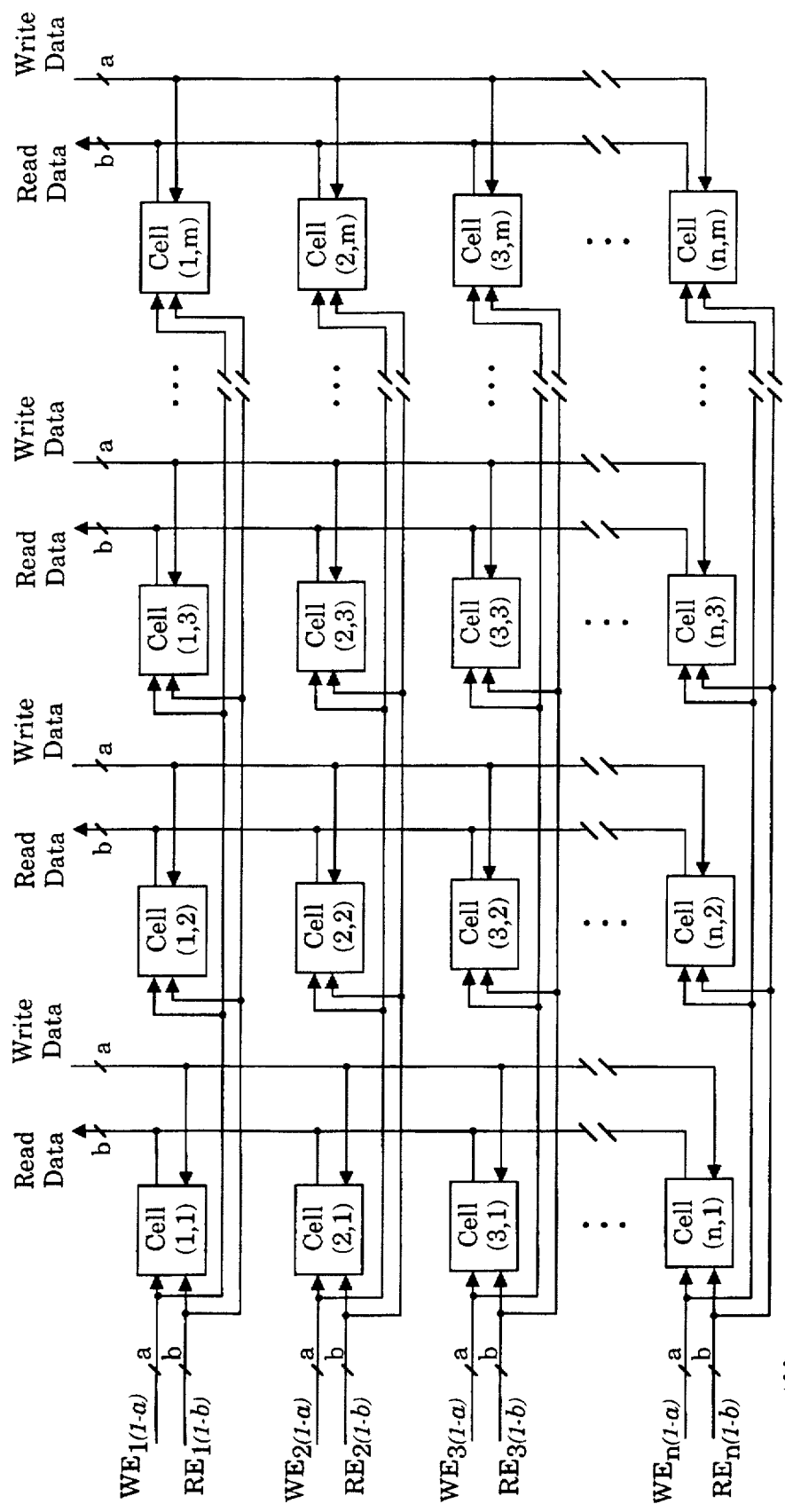
FIG. 4 illustrates a multi-port register configured in accordance with the present invention.

Referring to FIG. 4 a multi-port register configured in accordance with the present invention is illustrated. A multi-port register 400 contains a plurality of multi-port cells arranged in "n" rows and "m" columns. The multi-port register 400 of the present invention may comprise any number of rows and columns. The multi-port register 400 stores data entries in each row such that accessing a row via a particular port results in accessing an entire data entry stored in the corresponding row. Consequently, for the multi-port register 400, "n" data entries may be stored in "n" rows. Each multi-port cell illustrated in FIG. 4 may be configured in accordance with either the multi-port cell 100 illustrated in FIG. 1 or the multi-port cell 200 illustrated in FIG. 2. Because each multi-port cell contained in the multi-port register stores one bit of data, each row entry stores "m" bits.

As shown in FIG. 4, the multi-port register 400 contains "a" write ports and "b" read ports. Accordingly, each row entry in the multi-port register 400 contains "a" write enable (WE) lines and "b" read enable (RE) lines. For example, for the first row entry, write enable lines ($WE_{1(1-a)}$) and read enable lines ($RE_{1(1-a)}$) are coupled to each multi-port cell in the first row. Similarly, each multi-port cell contains "a" write data lines for each write port, and "b" read data lines for each read port. To read a row entry from a read port in the multi-port register 400, the read enable line corresponding to the read port and row entry is activated, and data are coupled to the corresponding read data lines. For example, to read row entry "n" on read port 2, the read enable line (RE$_{n2}$) is activated, and data are transferred out of each multi-port cell in row "n" via read data line (R2). An interface circuit to access a multi-port cell of the present invention is described in FIG. 3. In addition, for the multi-port register 400, additional information is provided to select the corresponding row entry in the multi-port register 400. Consequently, during a read operation, "b" row entries may be read from multi-port register 400, simultaneously.

In order to write data into a row entry in the multi-port register 400, the corresponding write enable line is activated, and data are supplied to the corresponding write data lines. For example, to write a data entry in row entry 2 on write port 1, the write enable lines (WE21) is activated and data are placed on write data line (W2). As described in conjunction with reference to FIG. 3, a write cycle is generated to write data to the multi-port register 400. During a write operation, "b" write operations may occur simultaneously. Although the multi-port register 400 is shown in FIG. 4 as containing row entries, entries may be stored in columns with corresponding column select read enable and write enable lines.

Figure 5:
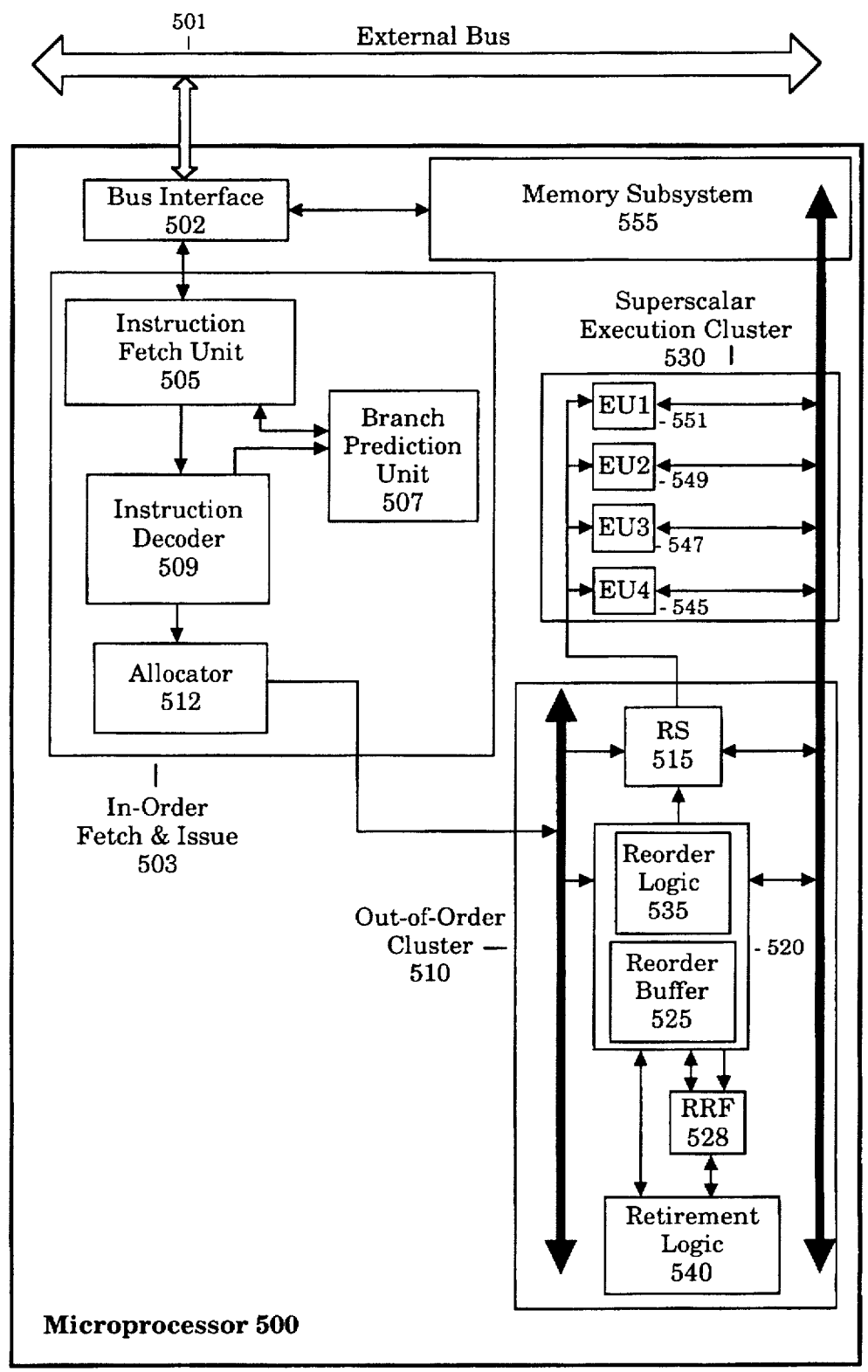
FIG. 5 illustrates a high level block diagram of an out-of-order superscaler microprocessor incorporating the multi-port register of the present invention.

The multi-port register of the present invention has application for use in a superscalar pipelined microprocessor performing out-of-order execution and speculative execution. Referring to FIG. 5, a high level block diagram of an out-of-order superscaler microprocessor 500 incorporating the multi-port register of the present invention is illustrated. FIG. 5 illustrates functional blocks of a superscaler pipelined microprocessor of the present invention. The microprocessor 500 contains an in-order fetch and issue cluster 503, an out-of-order cluster 510, and a superscalar execution cluster 530. In addition, microprocessor 500 contains a bus interface 502, coupled to an external bus 501, and a memory subsystem 555 for interfacing the microprocessor 500 to external memory.

The bus interface 502 interfaces the microprocessor 500 to peripheral components, including memory, via the external bus 501. The memory subsystem 555 is coupled to the bus interface 502 and provides a memory interface to cache memory and main memory. In one embodiment, the bus interface 501 attempts to load or store data from a high speed cache memory. Alternatively, the bus interface 501 accesses a main memory over the external bus 501. The bus interface 502 and memory subsystem 555 are intended to represent a broad category of interface devices which are well known in the art and will not be described further.

The bus interface 502 is coupled to a instruction fetch unit 505 located in the in-order fetch & issue cluster 503. The instruction fetch unit 505 retrieves microprocessor instructions, known as macro instructions, and operands for execution in the microprocessor 500. In a preferred embodiment, the microprocessor 500 is implemented as a pipelined processor so as to overlap the operation of instruction fetch, instruction decode and instruction execute. The instruction fetch unit 505 continually fetches macro instructions for the pipeline in the microprocessor 500. However, simple unconditional branch instructions within the instruction stream prevent the instruction fetch unit 505 from retrieving instructions in a purely sequential path. Furthermore, conditional branch instructions, within the instruction stream, prevent the instruction fetch unit 505 from retrieving instructions along a predetermined path because the condition requires resolution to ascertain the path.

In order to continually input macro instructions into the pipeline of microprocessor 500, the microprocessor 500 includes a branch prediction unit 507. The branch prediction unit 507 predicts the execution path of an instruction stream. In general, the branch prediction unit 507 predicts the existence of branch instructions within the instruction stream, and predicts the outcome of the branch. Consequently, as the macro instructions input to the pipeline proceeds down the pipeline stages, the macro instructions are "speculatively" executed because of the uncertainty that the branch was properly predicted. The multi-port register of the present invention supports the operation of speculative execution as is described more fully below.

The macro instructions retrieved are input to an instruction decoder 509. In general, the instruction decoder 509 decodes the macro instructions operation code and source data. In a preferred embodiment, the instruction decoder 509 receives Intel architecture compatible macro instructions, and determines the type of instruction received. The instruction decoder 509 breaks down the macro instruction into one or more micro-operations (micro-ops) with associated micro-operands. The one or more micro-ops corresponding to the decoded macro instruction specify the equivalent function.

The instruction decoder is coupled to an allocator 512, also located within the in-order fetch and issue cluster 503. The micro-ops generated in the instruction decoder 509 are input to the allocator 512. In general, the allocator 512 allocates resources necessary to execute each micro-op. In the preferred embodiment, the microprocessor 500 performs out-of-order execution, wherein micro-ops are executed out of the original program order. During retirement of the micro-ops, the original program order is restored. The allocation of resources to the out-of-order cluster is described below.

The out-of-order cluster 510 contains a reservation station (RS) 515, a reorder unit 520, a real register file (RRF) 528, and retirement logic 540. The reorder unit 520 comprises a reorder buffer 525 and reorder logic 535. The reorder buffer 525 is configured in accordance with the multi-port register 300 of the present invention. The reorder unit 520 provides capabilities for speculative execution, register renaming and out-of-order execution for the microprocessor 500. In a preferred embodiment of the present invention, the reorder buffer 525 is implemented as a multi-port register file. The reorder buffer 525 is managed as a first in first out (FIFO) register file. Both source reads and reorder buffer writebacks operate on the reorder buffer 525 as a register file. The RRF 528 comprises the architectural registers of the microprocessor 500.

The reorder buffer 525 supports out-of-order execution by allowing the superscaler execution unit 530 to complete execution of instructions and write-back the results without regard to other instructions that use the same logical register. Therefore, as far as the superscaler execution unit 530 is concerned, micro-ops complete out-of-order. Subsequently, logic in the out-of-order cluster 510 reorders the completed micro operations into the original sequence issued by the in order fetch and issue block 500. To support register renaming and out-of-order execution, the in order fetch and issue cluster 503 maintains a mapping of logical registers, located in the real register file 528, to physical registers allocated in the reorder buffer 525. In addition, the reorder buffer 525 supports speculative execution by buffering the results of the superscaler execution cluster 530 before committing the results to architecturally visible state in the RRF 528.

The reorder buffer 525 is utilized to support register renaming. In general, register renaming allocates a new physical register from a logical register, as the destination for a predefined architectural register. In microprocessor 500, register renaming renames logical registers associated with the RRF 528 and allocates physical registers in the reorder buffer 525. Consequently, by renaming the registers, the superscaler execution cluster 530 executes different instructions in overlapping clock cycles even though the instructions utilize the same architectural register because different physical registers are allocated in the reorder buffer 525 for each micro-op.

The allocator 512 allocates an entry in the reorder buffer 525. The allocator 512 allocates and deallocates entries in the reorder buffer 525 in a FIFO manner. Upon allocation of a micro-op to a reorder buffer entry, the allocator 512 provides the reorder unit 520 with physical destination addresses to identify the allocation. Each physical destination in the reorder buffer 525 contains micro-op result data, flags, a code for the result data, fault data, and a valid bit, which indicates whether or not the corresponding micro-op is valid. During the high phase of the system clock, the allocator 512 provides the three physical destination addresses to the reorder unit 520. In a subsequent low phase of the clock cycle, the in-order fetch and issue cluster 503 provides information to write entries into the reorder buffer 525. Also, on the low phase of the clock cycle, the entries are written into the reorder buffer 525. In a preferred embodiment, up to four micro-ops are allocated in the reorder buffer 525 in any given clock.

For each micro-op, the allocator 512 allocates an entry in the reservation station 515. Each entry in the reservation station 515 stores a valid bit, to indicate if the entry is valid, the micro-op instruction code, two source data entries and corresponding source data valid bits. In addition, the reservation station 515 stores two physical source fields identifying the location of the source data if the entry is not valid, and a physical destination for the result of the micro-op. Upon allocation of entries in the reservation station 515 and reorder buffer 525, each micro-op waits in the reservation station for both available resource data and an execution unit in the superscalar execution cluster 530. When the resource data and the appropriate execution unit are ready, the reservation dispatches the micro-op to an execution unit in the superscalar execution cluster 530.

The out-of-order cluster 510 is coupled to the superscaler execution cluster 530. The superscaler execution cluster 530 executes instructions utilizing source data stored in the reorder buffer 525 and the RRF 528. For the present embodiment, the superscalar execution cluster 530 comprises four execution units (EU1 551, EU2 549, EU3 547 and EU4 545). Specifically, the superscalar execution cluster comprises an address generation unit, an integer execution unit, a floating point execution unit, and a memory interface unit. Upon execution of the micro-op in the superscalar execution unit 530, the corresponding execution unit writes the result data, the architectural flags, and any fault information in the appropriate physical destination entry in the reorder buffer 525.

The retirement logic 540, contained within the out-of-order cluster 510, retires the write-back results stored in the reorder buffer 525 for each executed micro-op. In general, the retirement logic 540 retires reorder buffer 525 entries by evaluating the physical destination entries in the reorder buffer 525 in the order allocated. The retirement logic 540 retires the physical destination entries by transferring write-back data into a corresponding logical register in the RRF 528 so as to commit the write-back data to the current architectural state of the microprocessor 500. Because the allocator 512 allocates the physical destination entries in the reorder buffer 528 in the original program order, and the retirement logic 540 retires the physical destination entries in the same order, the original program order is maintained.

As discussed above, the allocator 512 allocates resources to the reorder buffer 525 to allocate physical registers to support speculative execution and register renaming. The reorder buffer 525 is accessed by the out-of-order logic 535 during a register rename and reorder buffer read (ROB read) stages. A read from the reorder buffer 525 occurs during the ROB read stage and consists of reading operand sources for the particular micro-op being executed in the superscalar execution cluster 530. In order to perform a read from the reorder buffer 525, the sources for the micro-ops are read from the reorder buffer 525. In a preferred embodiment of the present invention, the reorder buffer 525 contains 40 entries. Each micro-op issued by the in-order fetch and issue cluster 503 contains two source data locations. The source data locations may reside in the reorder buffer 525, real register file 528 or the in-order fetch and issue cluster 503 as currently decoded instructions. Because the superscalar execution cluster contains four execution units, a ROB read may require eight reads from the reorder buffer 525 (i.e. two source destinations for each micro-op executed). Consequently, the reorder buffer 525 requires up to eight dedicated read ports for the source read function.

The superscaler execution cluster 530, upon completion of executing micro-ops out-of-order, writes back result data to the reorder buffer 525. Specifically, when micro-ops are allocated to the reorder buffer 525, each micro-op is assigned with a reorder buffer entry. Consequently, the results computed by the superscaler execution unit 530 are written into the assigned reorder buffer entry during write back. As discussed above, in conjunction with the multi-port register of the present invention, the write back occurs during the low phase of the clock cycle. For the embodiment shown in FIG. 5, the reorder buffer 525 contains five write ports. The first four write back ports write back data and control information. The fifth write port is for stored data write backs, which comprises only of control information.

For retirement, the retirement logic 540 maintains a set of pointers which identify the entries in the reorder buffer 525 ready for retirement. In a first clock cycle, all pointers are broadcast to other units in the microprocessor 500. In the following clock cycle, all fields of the three entries pointed to by these pointers are read out of the reorder buffer 525. Consequently, the retirement read utilizes three read ports for every entry. Alternatively, a block read may be performed.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An apparatus for storing data comprising:
a storage device for storing at least two states;
at least one read port coupled to said storage device, said at least one read port comprising:

a read enable line for accessing said at least one read port;

a read data line;

a precharge circuit for charging said read data line to a predetermined voltage level;

a first switching element coupled to said storage device and to ground such that a first logic state stored in said storage device biases said first switching element to conduct current; and a second switching element coupling said first switching element to said read data line, and being controlled by said read enable line, such that an active enable signal on said read enable line results in a conductive path from said read data line to said first switching element, wherein said first switching element pulls said read data line to ground when said first state is stored in said storage device, and said read data line retains said predetermined voltage level when a second state is stored in said storage device;

at least one write port coupled to said storage device, said at least one write port comprising:

a write enable line;

a write data line;

a third switching element being controlled by said write data line and being coupled to ground such that a first state applied to said write data line results in conduction of current in said third switching element to ground;

a fourth switching element coupling said third switching element to said storage device, and being controlled by said write enable line, such that when said fourth switching element receives an active signal on said write enable line, a conductive path is formed from said storage device to ground; and a fifth switching element coupling said storage device to said write data line, and being controlled by said write enable line such that when said fifth switching element receives an active signal on said write enable line, a second state applied to said write data line drives said storage device to said second state.

2. The apparatus as set forth in claim 4 further comprising:

a clock circuit for generating a clock cycle including a first phase and a second phase;

a read control circuit coupled to said at least one read port and said clock circuit including a latch for latching data read from said storage device, wherein said pre-charge circuit charges said read data line during said first phase, said read control circuit also for generating an active enable signal on said read enable line for reading a corresponding read port during said second phase, and said latch for latching said data read from said storage device in response to the next transition from said second phase to said first phase; and a write control circuit coupled to said clock and said at least one write port for writing data to said storage device, said write control circuit for generating an active enable signal on a write enable line for a corresponding write port during said first phase and for bringing said write data line to a first state during said first phase so as to write said first state to said storage device.

3. The apparatus as set forth in claim 1 wherein said first, second, third and fourth switching elements comprise n-channel metal oxide semiconductor (MOS) transistors.

4. The apparatus as set forth in claim 2, wherein said third switching element is coupled to a single end of said storage device and being constructed large enough so as to drive said storage device to said first state on said write data line during said first phase.

5. A register comprising:

a cell capable of storing two states;

at least one read port coupled to said cell, said at least one read port comprising:

a read enable line;

a read data line;

a precharge circuit for charging said read data line to a predetermined voltage level;

a first transistor stack comprising:

a first transistor coupled to said cell and to ground such that a first logic state stored in said cell biases said first transistor to conduct current;

a second transistor coupling said first transistor to said read data line, and being controlled by said read enable line, such that an active enable signal on said read enable line results in a conductive path from said read data line to said first transistor, wherein said first transistor pulls said read data line to ground when said first state is stored in said cell, and said read data line retains said predetermined voltage level when a second state is stored in said cell;

at least one write port coupled to said cell, said at least one write port comprising:

a write enable line;

a write data line;

a second transistor stack comprising:

a third transistor being controlled by said write data line and being coupled to ground such that a first state applied to said write data line results in conduction of current in said third transistor to ground;

a fourth transistor coupling said third transistor to said cell, and being controlled by a write enable line, such that when said fourth transistor receives an active enable signal on said write enable line, a conductive path is formed from said cell to ground; and a fifth transistor coupling said cell to said write data line, and being controlled by said write enable line such that when said fifth transistor receives an active enable signal on said write enable line, a second state applied to said write data line drives said cell to said second state.

6. The register as set forth in claim 5 wherein said first transistor stack and said second transistor stack comprise n-channel metal oxide semiconductor (MOS) transistors.

7. The register as set forth in claim 5 further comprising:

a clock generating a clock signal having a first phase and a second phase;

read logic coupled to said at least one read port and said clock including at least one latch corresponding to said at least one read port for latching data read from said cell, wherein said pre-charge circuit charges said read data line during said first phase, and said read enable line receiving an active enable signal for reading said corresponding read port during said second phase, and said at least one latch latches said data read from said cell in response to the next transition from said second clock phase to said first clock phase; and write logic coupled to said clock and said at least one write port, said write logic for generating an active enable signal on a write enable line for a corresponding write port during said first phase and for bringing said write data line to a first state during said first phase so as to write said first state to said storage device.

8. The register as set forth in claim 7, wherein said fourth transistor is coupled to a single end of said cell and being constructed large enough so as to drive a state from said write data line to said cell during said first phase.

* * * * *